United States Patent
Sun et al.

(10) Patent No.: US 7,615,434 B2
(45) Date of Patent: Nov. 10, 2009

(54) CMOS DEVICE AND FABRICATING METHOD THEREOF

(75) Inventors: Shih-Wei Sun, Taipei (TW); Shih-Fang Tzou, Hsinchu Hsien (TW); Jiunn-Hsiung Liao, Shanhua Township, Tainan County (TW); Pei-Yu Chou, Shulin (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/389,617

(22) Filed: Mar. 24, 2006

(65) Prior Publication Data

US 2007/0238238 A1    Oct. 11, 2007

(51) Int. Cl.
*H01L 21/8238* (2006.01)
(52) U.S. Cl. ...................................... 438/199
(58) Field of Classification Search ................. 438/199, 438/724
See application file for complete search history.

(56) References Cited

U.S. PATENT DOCUMENTS

| | | | | |
|---|---|---|---|---|
| 4,271,583 A | * | 6/1981 | Kahng et al. ................. | 438/445 |
| 6,573,172 B1 | | 6/2003 | En et al. ..................... | 438/626 |
| 2004/0104405 A1 | * | 6/2004 | Huang et al. ................. | 257/199 |
| 2005/0214998 A1 | * | 9/2005 | Chen et al. .................. | 438/199 |
| 2005/0263825 A1 | * | 12/2005 | Frohberg et al. ............ | 257/369 |

* cited by examiner

*Primary Examiner*—Ronald W Leja
*Assistant Examiner*—Christopher J Clark
(74) *Attorney, Agent, or Firm*—J.C. Patents

(57) ABSTRACT

A CMOS device is provided, comprising a substrate, a first-type MOS transistor, a second-type MOS transistor, a first stress layer, a first liner layer, and a second stress layer. The substrate has a first active area and a second active area, which are separated by an isolation structure. Further, the first-type MOS transistor is disposed on the first active area of the substrate, and the second-type MOS transistor is disposed on the second active area of the substrate. The first stress layer is compliantly disposed on the first-type MOS transistor of the first active area. The first liner layer is compliantly disposed on the first stress layer. The second stress layer is compliantly disposed on the second-type MOS transistor of the second active area.

10 Claims, 7 Drawing Sheets

CMOS DEVICE AND FABRICATING METHOD THEREOF

BACKGROUND OF THE INVENTION

1. Field of Invention

The present invention relates to a semiconductor device and a fabricating method thereof, and more particularly to a CMOS device and a fabricating method thereof.

2. Description of Related Art

In the development of integrated circuit devices, the objects of high speed operation and low power consumption can be achieved by reducing the size of the device. However, since the technology of reducing the device size is limited by such factors as technique bottlenecks and expensive costs, other techniques for reducing the size of the device are desired to improve the driving current of the device. Therefore, it is proposed that the limitation of the device be overcome by using stress control in the channel area of the transistor. The method is by changing the space between the Si lattices through stress, so as to increase the mobility of electrons and holes, thereby improving the performance of the device.

A conventional method for enhancing the device performance by stress control is by using a silicon nitride layer as a contact etch stop layer (CESL) to generate stress, thus increasing the drive current of the device, to achieve the object of enhancing the device performance. However, when the tensile stress of the silicon nitride layer increases, the drive current of the n channel area increases, but the drive current of the p channel area decreases. On the contrary, when the compressive stress of the silicon nitride layer increases, the drive current of the p channel area increases, but the drive current of the n channel area decreases. In other words, the method for enhancing the transistor performance by using a silicon nitride layer to generate stress can only be used to improve the performance of the N-type MOS transistor or the performance of the P-type MOS transistor, but cannot improve the performances of the N-type MOS transistor and the P-type MOS transistor simultaneously.

In U.S. Pat. No. 6,573,172 B1, a method for improving the performance of N-type MOS transistor and P-type MOS transistor is provided. First, an N-type MOS transistor and a P-type MOS transistor are formed on a substrate, and a shallow trench isolation (STI) structure is formed there-between to isolate the N-type MOS transistor and the P-type MOS transistor. Then, a first silicon nitride layer is deposited to cover the whole substrate. Next, a patterned photoresist layer is formed on the first silicon nitride layer to expose the first silicon nitride layer on the N-type MOS transistor. Thereafter, an etching process is performed using the patterned photoresist layer as a mask, to remove the exposed first silicon nitride layer, and meanwhile the first silicon nitride layer on the P-type MOS remains. Then, the patterned photoresist layer is removed. Subsequently, an oxide layer is formed on the substrate to cover the first silicon nitride layer and the N-type MOS transistor. Then, a second silicon nitride layer is deposited in the same way to cover the whole substrate. Next, the second silicon nitride layer on the P-type MOS transistor is removed, while the second silicon nitride layer on the N-type MOS transistor is kept. Thus, silicon nitride layers having tensile stress and compressive stress can be formed respectively on the N-type MOS transistor and the P-type MOS transistor. Therefore, the object of simultaneously improving the performances of the N-type MOS transistor and the P-type MOS transistor can be achieved.

However, although the above method can simultaneously improve the performance of the N-type MOS transistor and the P-type MOS transistor, some problems still remain. For example, after the silicon nitride layer not covered by the photoresist layer is removed, the photoresist layer is generally removed by bumping the photoresist layer with oxygen plasma. However, in such way, the exposed film layers and components, e.g. spacers, metal silicide, and silicon dioxide layer and nickel silicide layer without STI structure of the transistor area, are easily damaged, thus affecting the performance and reliability of the device.

SUMMARY OF THE INVENTION

In view of the above, an object of the present invention is to provide a fabricating method of a CMOS device, which is capable of avoiding the damage caused in removing the photoresist layer in the prior art, and enhancing the performance of the N-type MOS transistor and the P-type MOS transistor.

Another object of the present invention is to provide a CMOS device, which is capable of avoiding the damage caused in removing the photoresist layer in the prior art, and enhancing the performance of the N-type MOS transistor and the P-type MOS transistor.

The present invention provides a fabricating method of a CMOS device, which comprises the following steps. First, a substrate is provided, which has a first active area and a second active area separated by an isolation structure. Then, a first-type MOS transistor and a second-type MOS transistor are formed respectively on the first active area and the second active area of the substrate. Next, a first stress layer is formed on the substrate, compliantly covering the first-type MOS transistor, the second-type MOS transistor, and the isolation structure. Thereafter, a first liner layer is compliantly formed on the first stress layer, wherein the first liner layer and first stress layer have a high etching selection ratio. Then, a first photoresist layer is formed on the first liner layer of the first active area. Next, a part of the first liner layer is removed until the surface of the first stress layer is exposed, with the first photoresist layer acting as a mask. Then, the first photoresist layer is removed. Subsequently, a part of the first stress layer is removed until the second-type MOS transistor is exposed, with the first liner layer acting as a mask. Next, a second stress layer is formed on the substrate, compliantly covering the second-type MOS transistor and the first liner layer. Thereafter, a second photoresist layer is formed on the second stress layer of the second active area. Next, a part of the second stress layer is removed until the surface of the first liner layer is exposed, with the second photoresist layer acting as a mask. And subsequently, the second photoresist layer is removed.

According to an embodiment of the present invention, the material of the first liner layer is, for example, silicon oxide, silicon oxynitride, silicon carbide, silicon oxycarbide, or amorphous carbon. The thickness of the first liner layer, for example, is between from 100 to 500 Å.

According to an embodiment of the present invention, the material of the first stress layer and the second stress layer is, for example, silicon nitride. Moreover, the method for forming the first stress layer and the second stress layer is, for example, a chemical vapor deposition process. And the thickness of the first stress layer and the second stress layer, for example, is between 500 to 1200 Å.

According to an embodiment of the present invention, after the step of forming the second stress layer, for example, a second liner layer can be further formed, compliantly covering the second stress layer, wherein the second liner layer and the second stress layer have a high etching selection ratio.

Then, a second photoresist layer is formed on the second liner layer of the second active area. Next, a part of the second liner layer is removed until the surface of the second stress layer is exposed, with the second photoresist layer acting as a mask. Then, the second photoresist layer is removed. Subsequently, a part of the second stress layer is removed until the surface of the first liner layer is exposed, with the second liner layer acting as a mask. The material of the second liner layer is, for example, silicon oxide, silicon oxynitride, silicon carbide, silicon oxycarbide, or amorphous carbon. The thickness of the second liner layer, for example, is between 100 to 500 Å.

According to an embodiment of the present invention, the first-type MOS transistor is an N-type MOS transistor, and the second-type MOS transistor is a P-type MOS transistor. The first stress layer is a tensile stress layer, and the second stress layer is a compressive stress layer.

According to an embodiment of the present invention, the first-type MOS transistor is a P-type MOS transistor, and the second-type MOS transistor is an N-type MOS transistor. The first stress layer is a compressive stress layer, and the second stress layer is a tensile stress layer.

The present invention further provides a CMOS device, which comprises a substrate, a first-type MOS transistor, a second-type MOS transistor, a first stress layer, a first liner layer, and a second stress layer. The substrate has a first active area and a second active area, which are separated by an isolation structure. Further, the first-type MOS transistor is disposed on the first active area of the substrate, and the second-type MOS transistor is disposed on the second active area of the substrate. The first stress layer is compliantly disposed on the first-type MOS transistor of the first active area. The first liner layer is compliantly disposed on the first stress layer. The second stress layer is compliantly disposed on the second-type MOS transistor of the second active area.

According to an embodiment of the present invention, the material of the first liner layer is, for example, silicon oxide, silicon oxynitride, silicon carbide, silicon oxycarbide, or amorphous carbon. The thickness of the first liner layer, for example, is between 100 to 500 Å.

According to an embodiment of the present invention, the material of the first and second stress layers is, for example, silicon nitride. The thickness of the first and second stress layers, for example, is between 500 to 1200 Å.

According to an embodiment of the present invention, the CMOS device further comprises a second liner layer compliantly disposed on the second stress layer. The material of the second liner layer is, for example, silicon oxide, silicon oxynitride, silicon carbide, silicon oxycarbide, or amorphous carbon. The thickness of the second liner layer, for example, is between 100 to 500 Å.

According to an embodiment of the present invention, the first-type MOS transistor is an N-type MOS transistor, and the second-type MOS transistor is a P-type MOS transistor. The first stress layer is a tensile stress layer, and the second stress layer is a compressive stress layer.

According to an embodiment of the present invention, the first-type MOS transistor is a P-type MOS transistor, and the second-type MOS transistor is an N-type MOS transistor. The first stress layer is a compressive stress layer, and the second stress layer is a tensile stress layer.

In the present invention, a liner layer is formed on the stress layer to be used as a hard mask layer, thus avoiding the direct damage to the exposed film layers or components when removing the photoresist layer, and further the performance and reliability of the device can be improved. On the other hand, the object of simultaneously improving the performance of the N-type MOS transistor and the P-type MOS transistor can be achieved in the present invention.

In order to the make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A to 1J are cross-sectional views of the flow for fabricating a CMOS device according to an embodiment of the present invention.

Figure 1A:
FIGS. 1A to 1J are cross-sectional views of the process flow for fabricating a CMOS device according to an embodiment of the present invention.
Figure 1A:
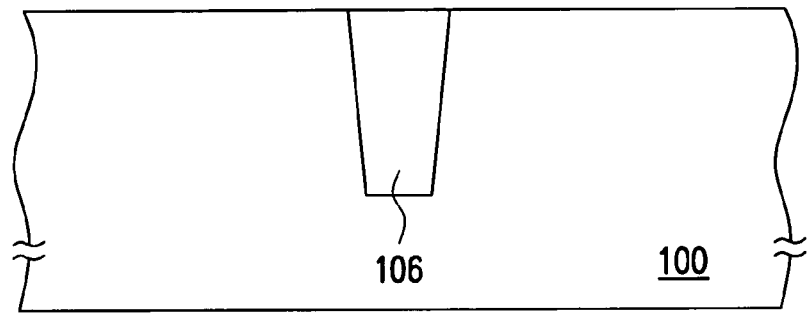

First, referring to FIG. 1A, a substrate 100 is provided. The substrate 100 has active areas 102, 104, which are separated by an isolation structure 106. The isolation structure 106 is, for example, a shallow trench isolation structure or other suitable isolation structures.

Figure 1B:
Figure 1B:
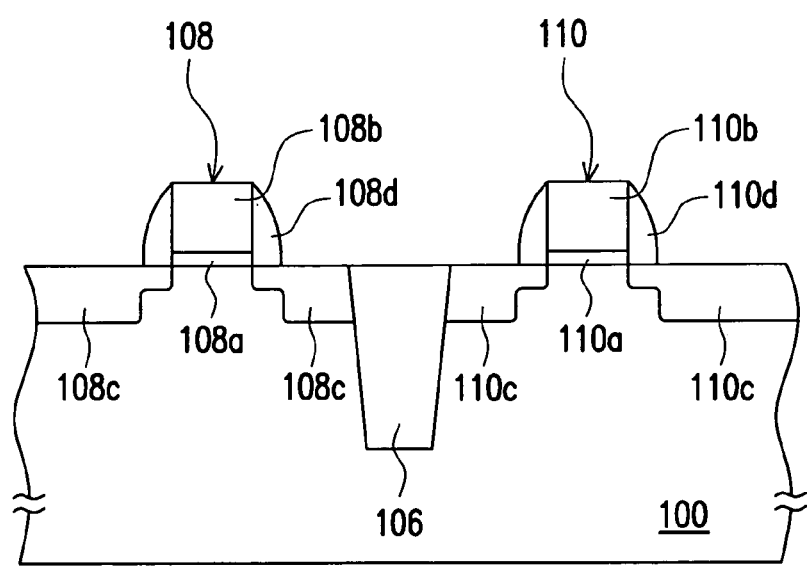

Then, referring to FIG. 1B, a first-type MOS transistor 108 and a second-type MOS transistor 110 are formed respectively on the active areas 102, 104 of the substrate 100. In the present embodiment, the first-type MOS transistor 108 and the second-type MOS transistor 110 are illustrated by an N-type MOS transistor and a P-type MOS transistor. The first-type MOS transistor 108 comprises a gate dielectric layer 108a, a gate 108b, a source/drain area 108c, and a spacer 108d. The second-type MOS transistor 110 comprises a gate dielectric layer 110a, a gate 110b, a source/drain area 110c, and a spacer 110d.

In an embodiment, a metal silicide layer (not shown) can be further formed respectively on the gate 108b and source/drain area 108c, and on the gate 110b and source/drain area 110c, for reducing the resistance. The material of the metal silicide layer is, for example, nickel silicide, tungsten silicide, cobalt silicide, and the like. The materials and fabricating methods of the first-type MOS transistor 108 and the second-type MOS transistor 110 are all known to those skilled in the art, and will not be described herein.

Figure 1C:
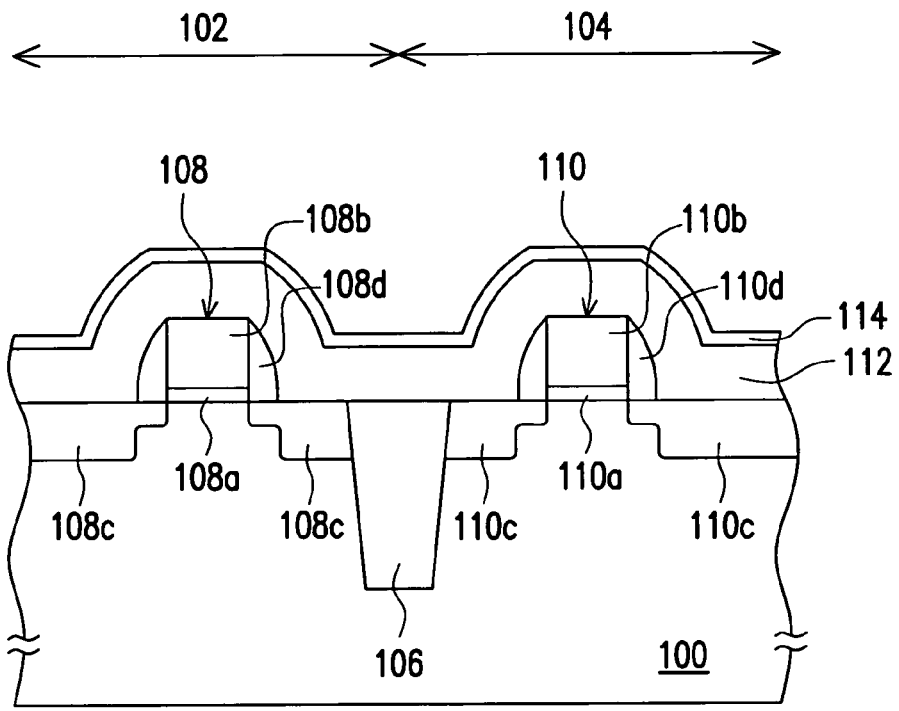

Thereafter, referring to FIG. 1C, a first stress layer 112 is formed on the substrate 100, compliantly covering the first-type MOS transistor 108, the second-type MOS transistor 110, and the isolation structure 106. The thickness of the first stress layer 112, for example, ranges form 500 to 1200 Å. The material of the first stress layer 112 is, for example, silicon nitride or other suitable stress materials, and the fabricating method thereof is, for example, chemical vapor deposition or another suitable method. In this embodiment, the first stress layer 112 is a tensile stress layer.

Then, a liner layer 114 is compliantly formed on the first stress layer 112. The liner layer 114 and the first stress layer 112 have a high etching selection ratio. The material of the liner layer 114 is, for example, silicon oxide, silicon oxynitride, silicon carbide, silicon oxycarbide, or amorphous carbon, and the fabricating method thereof is, for example, a chemical vapor deposition process or another suitable method. The thickness of the liner layer 114, for example, ranges from 100 to 500 Å.

Figure 1D:
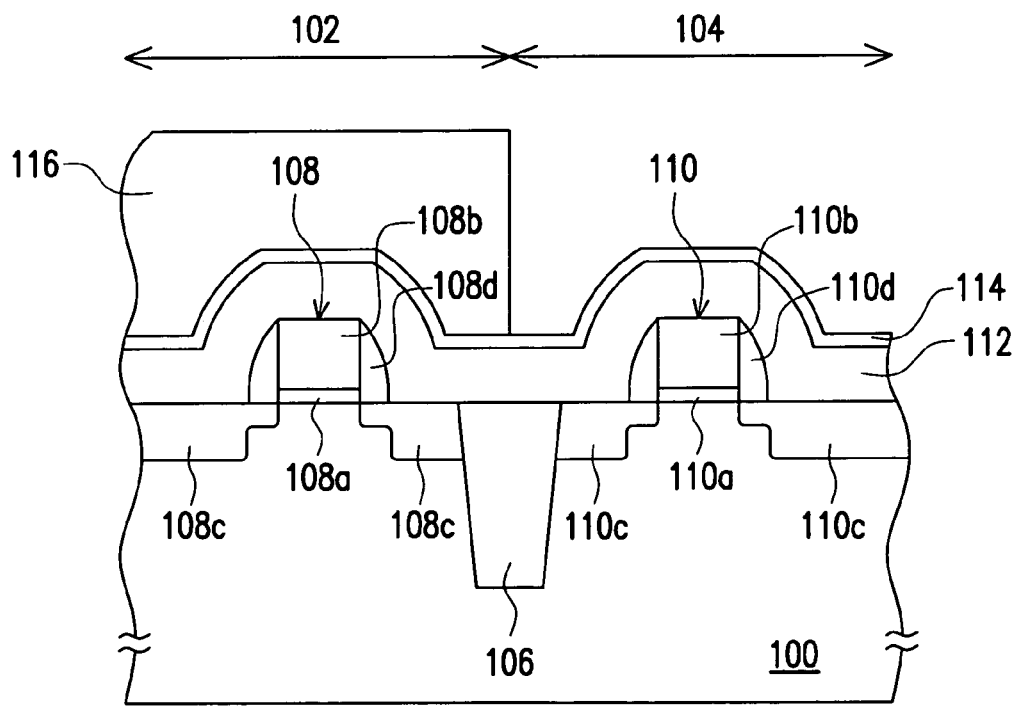

Subsequently, referring to FIG. 1D, a photoresist layer 116 is formed on the liner layer 114 of the active area 102. The fabricating method of the photoresist layer 116 is, for example, a spin coating process. And the material of the photoresist layer 116 is, for example, photo-resistive material formed by a mixture of resin, photo-sensitive agent, and solvent.

Figure 1E:
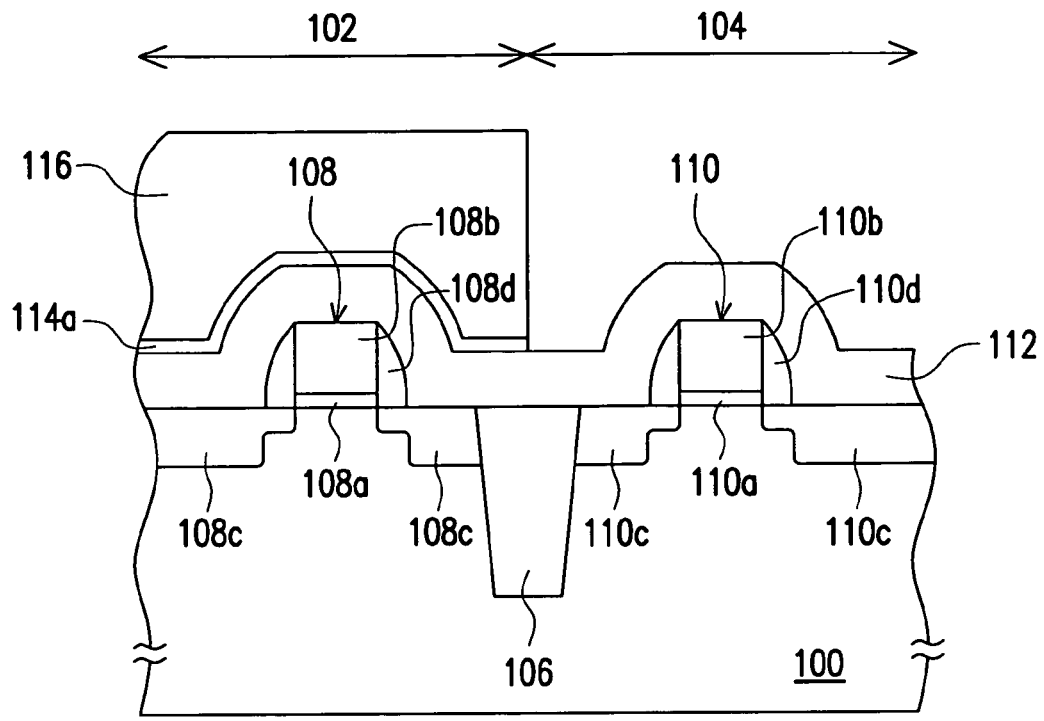

Then, referring to FIG. 1E, a part of the liner layer 114 is removed until the surface of the first stress layer 112 is exposed, with the photoresist layer 116 acting as a mask, to form a liner layer 114a. The method for removing a part of the liner layer 114 until the surface of the first stress layer 112 is exposed is, for example, an etching process.

Figure 1F:
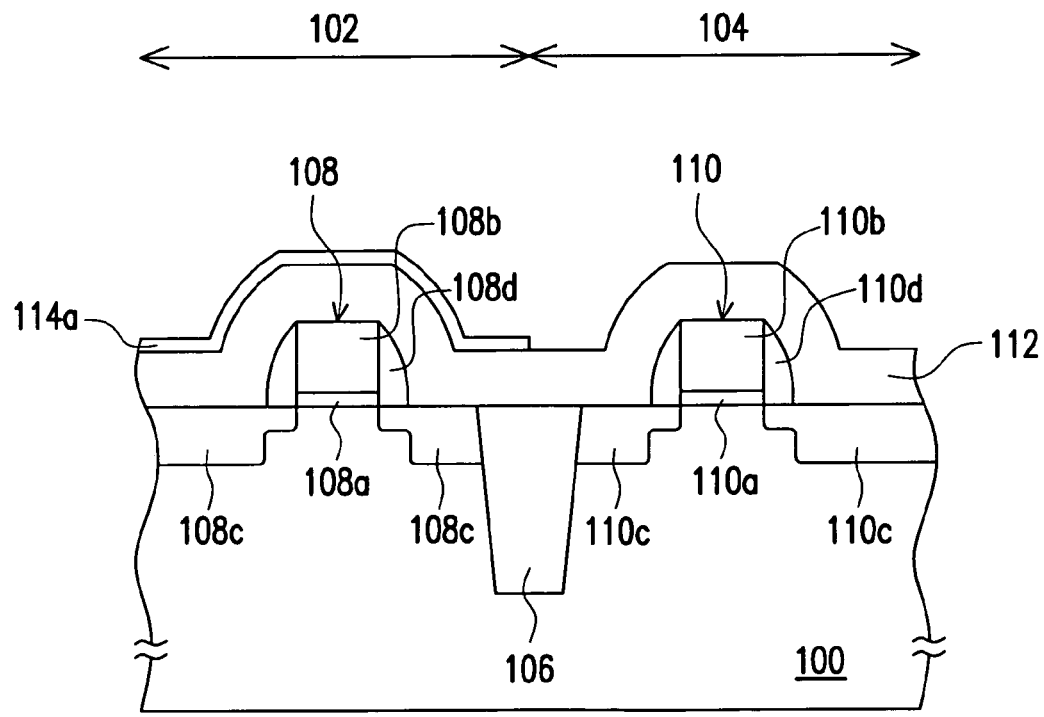

Next, referring to FIG. 1F, the photoresist layer 116 is removed. The method for removing the photoresist layer 116 is, for example, a dry photoresist removing method using oxygen plasma, or a wet photoresist removing method using solvents.

Figure 1G:
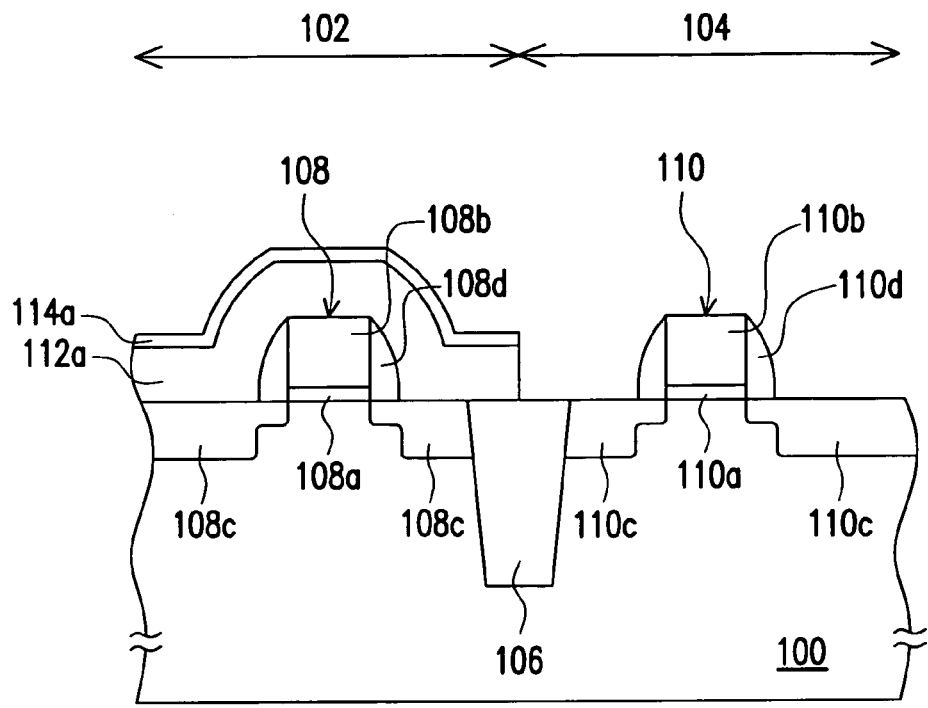

Then, referring to FIG. 1G, a part of the first stress layer 112 is removed until the second-type MOS transistor 110 is exposed, with the liner layer 114a acting as a mask, to form a first stress layer 112a. The method for removing a part of the first stress layer 112 until the surface of the second-type MOS transistor 110 is exposed is, for example, an etching process.

It should be noted that, in the present invention, the liner layer 114a is used as a hard mask layer, to remove a part of the first stress layer 112. Therefore, the direct damage to the exposed film layers or components when removing the photoresist layer in the prior art can be avoided, and the performance and reliability of the device can be improved.

Figure 1H:
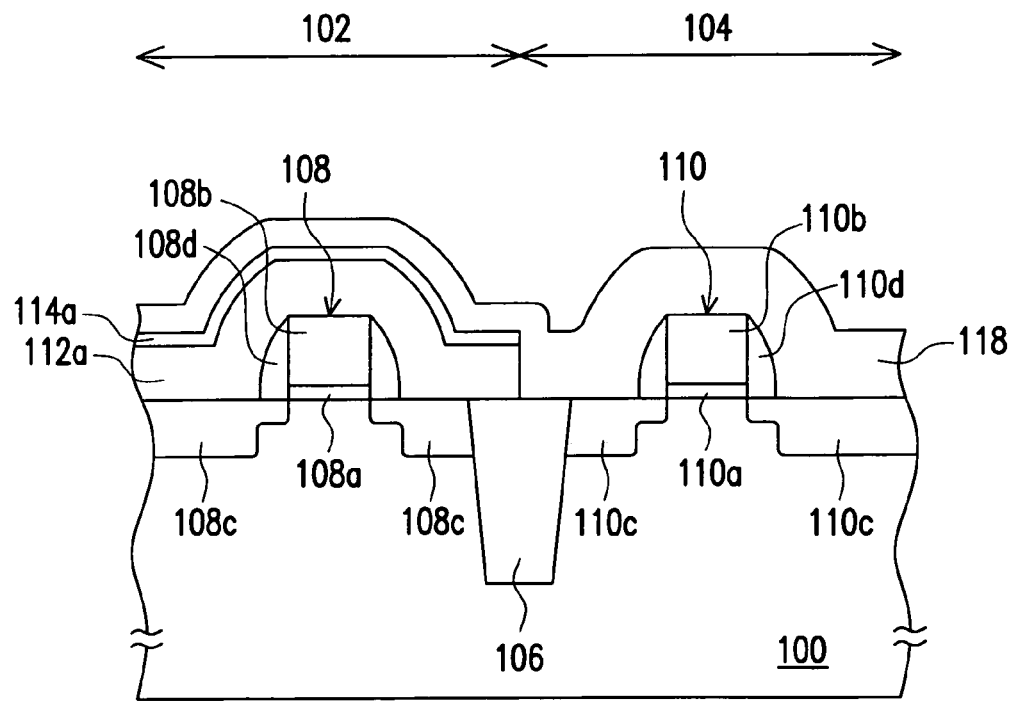

Thereafter, referring to FIG. 1H, a second stress layer 118 is formed on the substrate 100, to cover the second-type MOS transistor 110 and the liner layer 114a. The thickness of the second stress layer 118, for example, ranges from 500 to 1200 Å. The material of the second stress layer 118 is, for example, silicon nitride or another suitable stress material, and the fabricating method thereof is, for example, a chemical vapor deposition process or another suitable method. In this embodiment, the second stress layer 118 is a compressive stress layer.

Figure 1I:
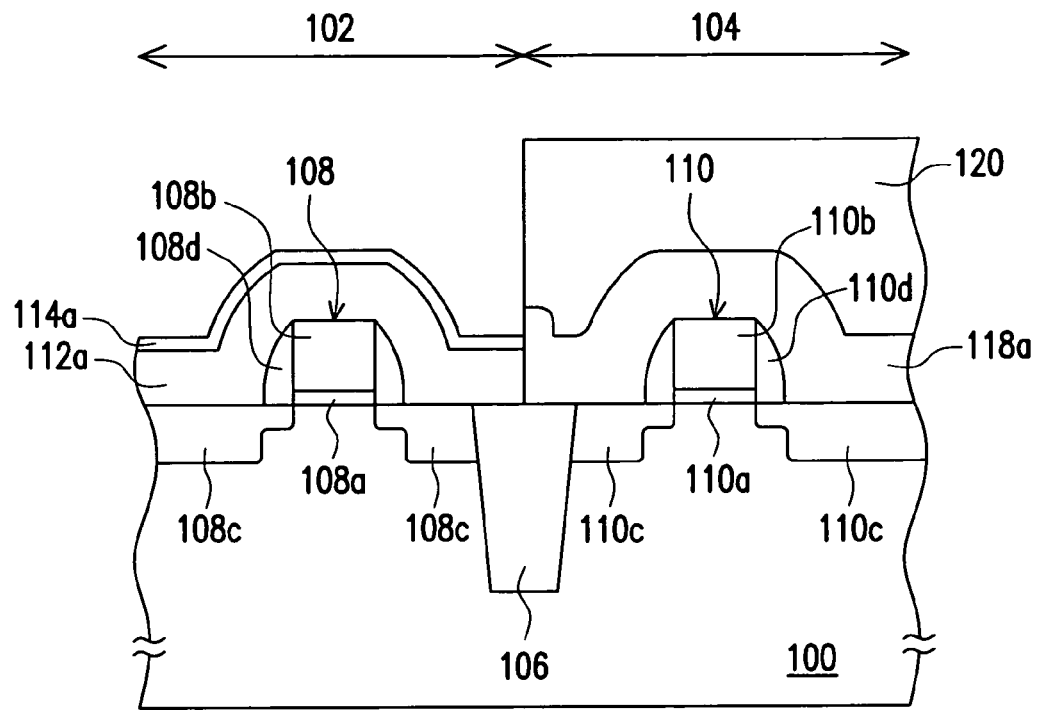

Subsequently, referring to FIG. 1I, a photoresist layer 120 is formed on the second stress layer 118 of the second active area 104. The method for fabricating the photoresist layer 120 is, for example, a spin coating process, and the material of the photoresist layer is, for example, photo-resistive material formed by a mixture of resin, photo-resistive agent, and solvent. Then, a part of the second stress layer 118 is removed until the surface of the liner layer 114a is exposed, with the photoresist layer 120 acting as a mask, and with the liner layer 114a acting as an etching stop layer.

Figure 1J:
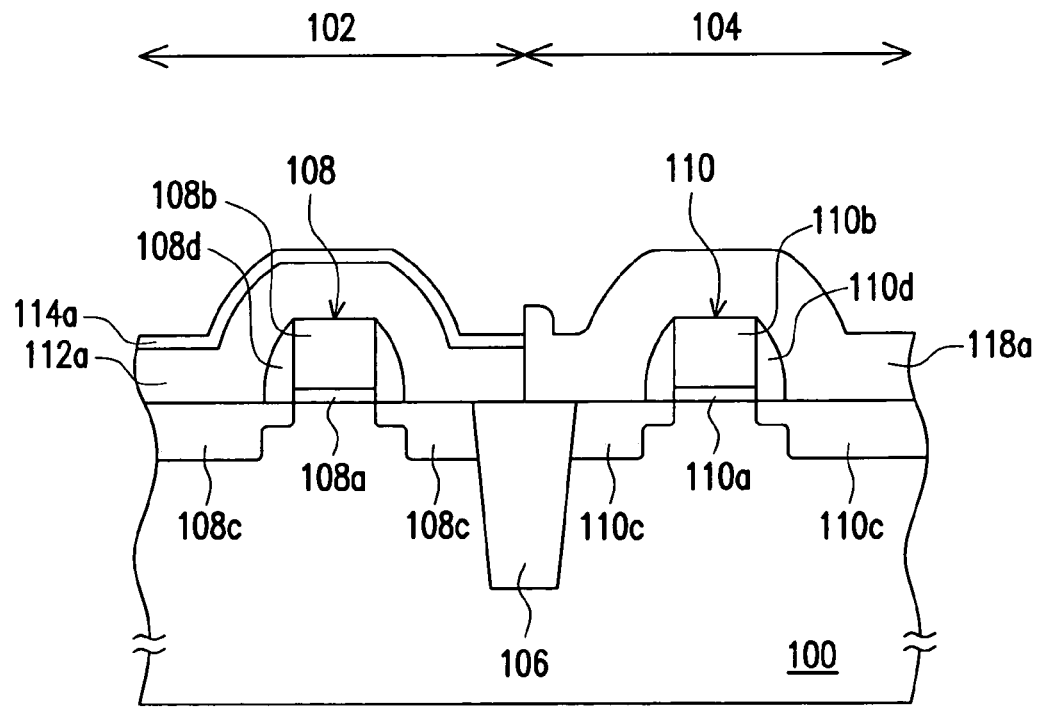

Next, referring to FIG. 1J, the photoresist layer 120 is removed. The method for removing the photoresist layer 120 is, for example, a dry photoresist removing method using oxygen plasma, or a wet photoresist removing method using solvents.

In the embodiments of the above FIG. 1A to FIG. 1J, the first-type MOS transistor 108 and the second-type MOS transistor 110 are illustrated in detail by an N-type MOS transistor and a P-type MOS transistor respectively. However, the present invention is not limited thereto. The first-type MOS transistor 108 and the second-type MOS transistor 110 of the present invention can also be a P-type MOS transistor and an N-type MOS transistor respectively. The first stress layer 112 and the second stress layer 118 are a compressive stress layer and a tensile stress layer respectively.

Of course, after the second stress layer 118a is formed, a subsequent interconnect process can be performed. The interconnect process is, for example, forming a dielectric layer (not shown) on the substrate 100 to cover the liner layer 114a and the second stress layer 118a. Then, a contact window opening (not shown) is formed in the dielectric layer, the first stress layer 112a, the liner layer 114a, and the second stress layer 118a. Then, a conductor material layer (not shown) is formed in the contact window opening to be used as a contact window, such that the devices can be electrically connected with each other.

Next, the structure of the CMOS device formed by the above fabricating method of a CMOS device will be illustrated.

Referring back to FIG. 1J, the CMOS device comprises a substrate 100, a first-type MOS transistor 108, a second-type MOS transistor 110, a first stress layer 112a, a second stress layer 118a, and a liner layer 114a. The substrate 100 has a first active area 102 and a second active area 104. The first active area 102 and the second active area 104 are separated by an isolation structure 106. The first-type MOS transistor 108 is disposed on the first active area 102 of the substrate 100, and the second-type MOS transistor 110 is disposed on the second active area 104 of the substrate 100. Furthermore, the first stress layer 112a is compliantly disposed on the first-type MOS transistor 108 of the first active area 102. The material of the first stress layer 112a is, for example, silicon nitride or another suitable stress material, and the thickness thereof, for example, ranges from 500 to 1200 Å. The liner layer 114a is compliantly disposed on the first stress layer 112a. The material of the liner layer 114a is, for example, silicon oxide, silicon oxynitride, silicon carbide, silicon oxycarbide, or amorphous carbon, and the thickness thereof, for example, ranges from 100 to 500 Å. Further, the second stress layer 118a is compliantly disposed on the second-type MOS transistor 110 of the second active area 104. The material of the second stress layer 118a is, for example, silicon nitride or another suitable stress material, and the thickness thereof, for example, ranges from 500 to 1200 Å.

Figure 2A:
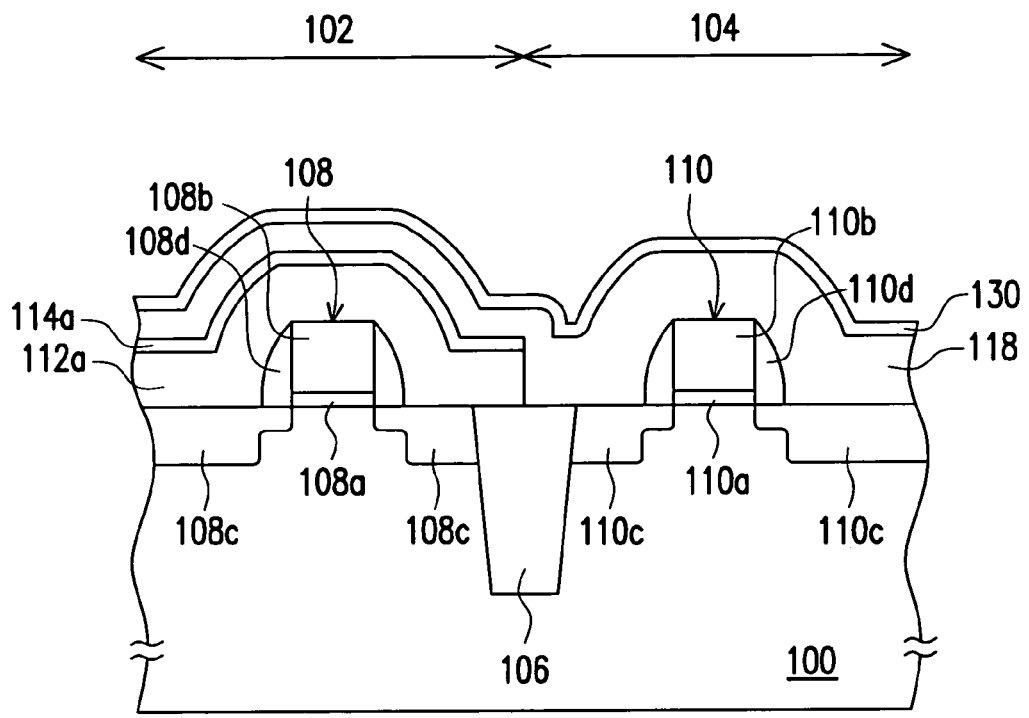
FIGS. 2A to 2D are cross-sectional views of the process flow for fabricating a CMOS device according to another embodiment of the present invention.

In addition to the above embodiments, the present invention also provides other implementations. FIG. 2A to FIG. 2D are cross-sectional views of the process flow for fabricating a CMOS device according to another embodiment of the present invention. FIG. 2A follows the above embodiment of FIG. 1H. The like components in FIG. 2A to FIG. 2D and in FIG. 1A to FIG. 1J use the same symbols, and the illustrations thereof are omitted herein.

First, referring to FIG. 2A, after the second stress layer 118 is formed, a liner layer 130 can be formed compliantly, covering the second stress layer 118, wherein the liner layer 130 and the second stress layer 118 have a high etching selection ratio. The material of the liner layer 130 is, for example, silicon oxide, silicon oxynitride, silicon carbide, silicon oxycarbide, or amorphous carbon, and the fabricating method thereof is, for example, a chemical vapor deposition process or another suitable method. The thickness of the liner layer 130, for example, ranges form 100 to 500 Å.

Figure 2B:
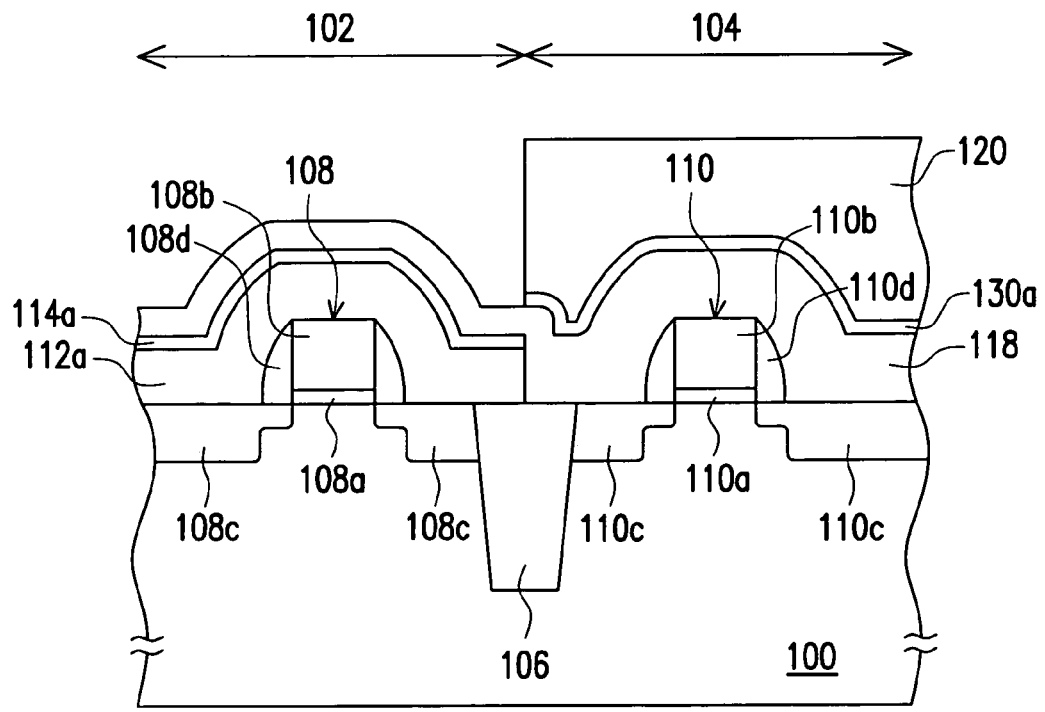

Next, referring to FIG. 2B, a photoresist layer 120 is formed on the liner layer 130 of the second active area 104. Then, a part of the liner layer 130 is removed until the surface of the second stress layer 118 is exposed, with the photoresist layer 120 acting as a mask, to form a liner layer 130a. The method for removing a part of the liner layer 130 until the surface of the second stress layer 118 is exposed is, for example, an etching process.

Figure 2C:
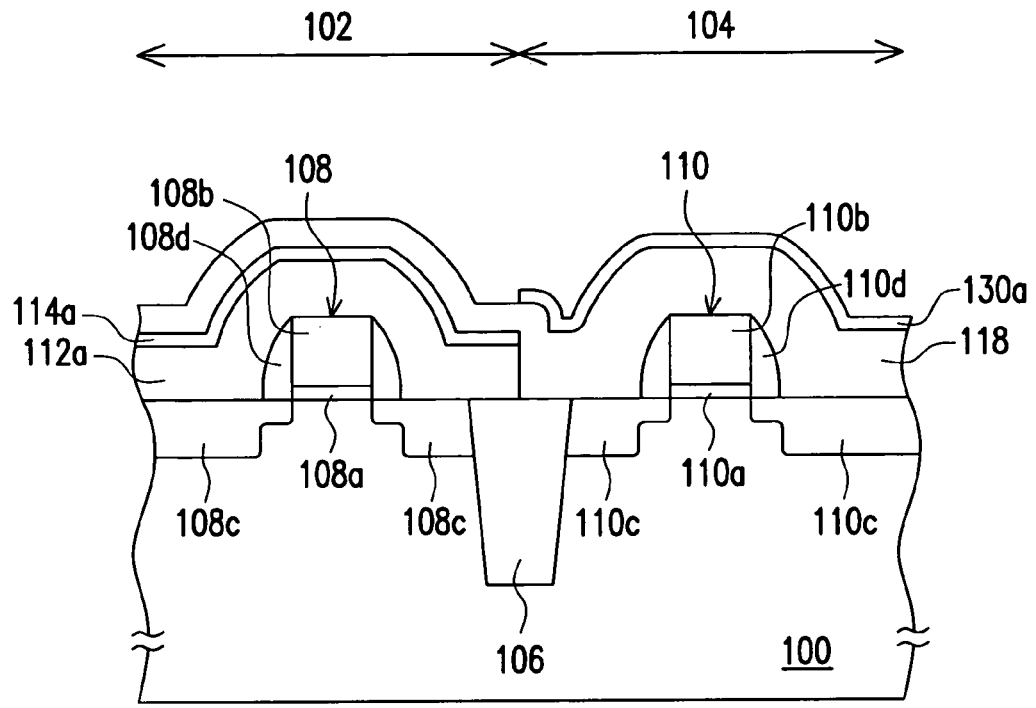
Figure 2D:
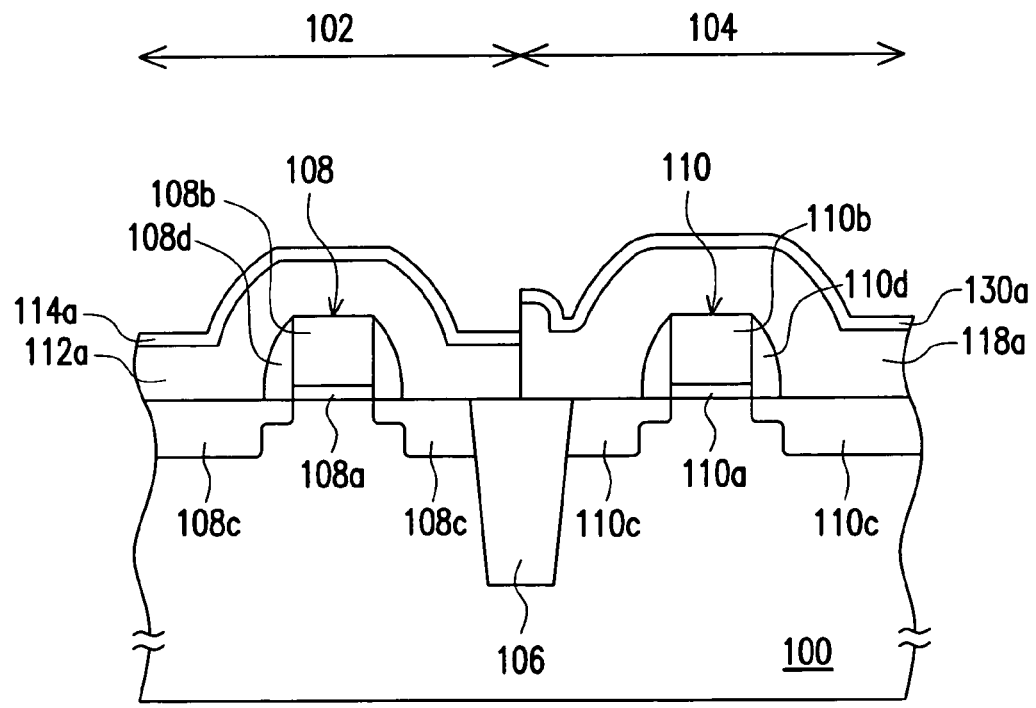

Thereafter, referring to FIG. 2C, the photoresist layer 120 is removed. Next, referring to FIG. 2D, a part of the second stress layer 118 is removed until the surface of the liner layer 114a is exposed, with the liner layer 130a acting as a mask, to form a liner layer 130a. Similarly, the liner layer 130a can be used as a hard mask layer to remove a part of the second stress layer 118.

Of course, after the liner layer 130a is formed, a subsequent interconnect process can be further preformed. The interconnect process is, for example, forming a dielectric layer (not shown) on the substrate 100, to cover the liner layer 114a and the liner layer 130a. Then, a contact window opening (not shown) is formed in the dielectric layer, the first stress layer 112a, the liner layer 114a, the liner layer 130a, and the second stress layer 118a. Then, a conductor material layer (not shown) is formed in the contact window opening to form a contact window, such that the devices can be electrically connected with each other.

Next, the CMOS device fabricated by the above method will be illustrated. Returning to FIG. 2D, in addition to the CMOS device of FIG. 1J, the CMOS device of the present embodiment further comprises a liner layer 130a compliantly disposed on the second stress layer 118a. The material of the liner layer 114a is, for example, silicon oxide, silicon oxynitride, silicon carbide, silicon oxycarbide, or amorphous carbon, and the thickness thereof, for example, ranges from 100 to 500 Å.

To sum up, in the present invention, a liner layer formed on the stress layer is used as a hard mask layer, thus the object of simultaneously improving the performance of the N-type MOS transistor and the P-type MOS transistor can be achieved. Also, the direct damage to the exposed film layers or components when removing the photoresist layer in the prior art can be avoided, thus the performance and reliability of the device can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabricating method of a CMOS device, comprising:
providing a substrate having a first active area and a second active area separated by an isolation structure;
forming a first-type MOS transistor and a second-type MOS transistor respectively on the first active area and the second active area of the substrate;
forming a first stress layer on the substrate, compliantly covering the first-type MOS transistor, the second-type MOS transistor, and the isolation structure;
compliantly forming a first liner layer on the first stress layer, wherein the first liner layer and the first stress layer have a high etching selection ratio;
forming a first photoresist layer on the first liner layer of the first active area;
patterning the first liner layer with the first photoresist layer to remove the first liner layer in the second active area;
removing the first photoresist layer;
patterning the first stress layer by using the patterned first liner layer as a first mask to remove the first stress layer in the second active area, after the first photoresist layer is removed, wherein the first stress layer is directly in contact with the first-type MOS transistor;
forming a second stress layer on the substrate, compliantly covering the second-type MOS transistor and the first liner layer;
compliantly forming a second liner layer on the second stress layer, wherein the second liner layer and the second stress layer have a high etching selection ratio;
forming a second photoresist layer on the second liner layer of the second active area;
patterning the second liner layer with the second photoresist layer to remove the second liner layer in the first active area;
removing the second photoresist layer; and
patterning the second stress layer by using the patterned second liner layer as a second mask to remove the second stress layer in the first active area after the second photoresist layer is removed, wherein the second stress layer is directly in contact with the second-type MOS transistor, the patterned second liner layer remains on the second active area, and the patterned first liner layer remains on the first active area.

2. The fabricating method of a CMOS device as claimed in claim 1, wherein a material of the first liner layer comprises silicon oxide, silicon oxynitride, silicon carbide, silicon oxycarbide, or amorphous carbon.

3. The fabricating method of a CMOS device as claimed in claim 1, wherein a thickness of the first liner layer ranges from 100 to 500 Å.

4. The fabricating method of a CMOS device as claimed in claim 1, wherein a material of the first stress layer and the second stress layer comprises silicon nitride.

5. The fabricating method of a CMOS device as claimed in claim 1, wherein the fabricating process of the first stress layer and the second stress layer comprises a chemical vapor deposition process.

6. The fabricating method of a CMOS device as claimed in claim 1, wherein the thickness of the first stress layer and the second stress layer ranges from 500 to 1200 Å.

7. The fabricating method of a CMOS device as claimed in claim 1, wherein the material of the second liner layer comprises silicon oxide, silicon oxynitride, silicon carbide, silicon oxycarbide, or amorphous carbon.

8. The fabricating method of a CMOS device as claimed in claim 1, wherein the thickness of the second liner layer ranges from 100 to 500 Å.

9. The fabricating method of a CMOS device as claimed in claim 1, wherein the first-type MOS transistor is an N-type MOS transistor and the second-type MOS transistor is a P-type MOS transistor, while the first stress layer is a tensile stress layer and the second stress layer is a compressive stress layer.

10. The fabricating method of a CMOS device as claimed in claim 1, wherein the first-type MOS transistor is a P-type MOS transistor and the second-type MOS transistor is an N-type MOS transistor, while the first stress layer is a compressive stress layer and the second stress layer is a tensile stress layer.

* * * * *